United States Patent
Kang et al.

(10) Patent No.: US 7,310,268 B2
(45) Date of Patent: *Dec. 18, 2007

(54) FLOAT GATE MEMORY DEVICE

(75) Inventors: Hee Bok Kang, Daejeongwangyeok-si (KR); Jin Hong Ahn, Gyeonggi-do (KR); Jae Jin Lee, Gyeonggi-do (KR)

(73) Assignee: Hynix Semiconductor Inc., Icheon-Si (KR)

( * ) Notice: Subject to any disclaimer, the term of this patent is extended or adjusted under 35 U.S.C. 154(b) by 177 days.

This patent is subject to a terminal disclaimer.

(21) Appl. No.: 11/115,301

(22) Filed: Apr. 27, 2005

(65) Prior Publication Data

US 2006/0138519 A1 Jun. 29, 2006

(30) Foreign Application Priority Data

Dec. 29, 2004 (KR) ............... 10-2004-0115420
Dec. 29, 2004 (KR) ............... 10-2004-0115421

(51) Int. Cl.
*G11C 16/04* (2006.01)
(52) U.S. Cl. .................. 365/185.17; 365/185.11
(58) Field of Classification Search ......... 365/185.17, 365/185.11; 257/314, 315, 316
See application file for complete search history.

(56) References Cited

U.S. PATENT DOCUMENTS

| 5,446,299 | A | * | 8/1995 | Acovic et al. ............ 257/316 |
| 5,691,552 | A | * | 11/1997 | Oyama ................... 257/316 |
| 5,768,176 | A | | 6/1998 | Katoh |
| 5,929,479 | A | * | 7/1999 | Oyama ................... 257/315 |
| 6,136,650 | A | | 10/2000 | Lee ...................... 438/257 |
| 6,154,391 | A | | 11/2000 | Takeuchi et al. |
| 6,240,013 | B1 | | 5/2001 | Nishimura |
| 6,525,379 | B2 | * | 2/2003 | Nomoto et al. ........... 257/347 |
| 6,538,916 | B2 | | 3/2003 | Ohsawa |
| 2004/0000679 | A1 | | 1/2004 | Patel ..................... 257/216 |
| 2004/0124466 | A1 | | 7/2004 | Walker .................. 257/344 |

FOREIGN PATENT DOCUMENTS

| JP | 09-097851 | 4/1997 |
| JP | 2001-110192 | 4/2001 |
| JP | 2002-064187 | 2/2002 |
| JP | 2002-150766 | 5/2002 |

* cited by examiner

*Primary Examiner*—Vu A. Le
(74) *Attorney, Agent, or Firm*—Townsend and Townsend and Crew LLP

(57) ABSTRACT

A float gate memory device comprises a bottom word line, a float channel layer formed on the bottom word line and kept at a floating state, a float gate, and a top word line formed on the float gate in parallel with the bottom word line. In the float gate formed on the float channel, data are stored. Here, data are written in the float gate depending on levels of the bottom word line and the top word line, and different channel resistances are induced to the float channel depending on polarity states of charges stored in the float gate, so that data are read. As a result, in the float gate memory device, a retention characteristic is improved, and cell integrated capacity is also increased due to a plurality of float gate cell arrays deposited vertically using a plurality of cell oxide layers.

31 Claims, 17 Drawing Sheets

FLOAT GATE MEMORY DEVICE

BACKGROUND OF THE INVENTION

1. Field of the Invention

The present invention generally relates to a float gate memory device, and more specifically, to a nano scale float gate memory device having an improved retention characteristic and cell integrated capacity obtained by depositing a plurality of float gate cell arrays vertically with a plurality of cell insulating layers.

2. Description of the Related Art

FIG. 1 is a cross-sectional diagram illustrating a memory cell of a conventional float gate memory device.

A memory cell of the conventional float gate memory device comprises a N-type drain region 4 and a N-type source region 6 which are formed in a P-type substrate 2, a first insulating layer 8, a float gate 10, a second insulating layer 12 and a word line 14 which are sequentially formed on the channel region.

In the above-described memory cell of the convention float gate memory device, a channel resistance of the memory cell is differentiated by a state of charges stored in the float gate 10.

That is, since positive channel charges are induced to the channel when electrons are stored in the float gate 10, the memory cell becomes at a high resistance state to be turned off.

Meanwhile, negative channel charges are induced to the channel when positive holes are stored in the float gate 10, so that the memory cell becomes at a low resistance state to be turned on.

In this way, data are written in the memory cell by selecting kinds of charges of the float gate 10, so that the memory cell can be operated as a nonvolatile memory cell.

However, since the retention characteristic is degraded when the size of the memory cell of the conventional float gate memory device becomes smaller, it is difficult to perform a normal operation.

Specifically, since the retention characteristic of the memory cell having a float gate structure of a nano scale level becomes weaker even in a low voltage stress, a random voltage cannot be applied to a word line in a read mode.

SUMMARY OF THE INVENTION

Accordingly, it is an object of the present invention to operate a memory cell having a float gate structure of a nano scale level in a low voltage.

It is another object of the present invention to improve cell integrated capacity by depositing a plurality of float gate cell arrays vertically with a plurality of cell insulating layers.

In an embodiment, a float gate memory device comprises a bottom word line, a float channel layer formed on the bottom word line and kept at a floating state, a float gate, and a top word line formed on the float gate in parallel with the bottom word line. In the float gate formed on the float channel, data are stored. Here, data are written in the float gate depending on levels of the bottom word line and the top word line, and data are read according to different channel resistances induced to the float channel depending on polarity states of charges stored in the float gate.

In another embodiment, a float gate memory device comprises a bottom word line, a first insulating layer formed on the bottom word line, a P-type float channel formed on the first insulating layer and kept at a floating state, a second insulating layer formed on the P-type float channel, a float gate, a third insulating layer formed on the float gate, a top word line formed on the third insulating layer, and a N-type drain region and a N-type source region formed at both sides of the float channel. In the float gate formed on the second insulating layer, charges are stored. Here, data are written in the float gate depending on levels of the bottom word line and the top word line, and data are read according to different channel resistances induced to the float channel depending on polarity states of charges stored in the float gate.

In still another embodiment, a float gate memory device comprises a plurality of unit memory cell arrays. Each of the plurality of unit memory cell arrays includes a plurality of float gate memory cells. Here, the float gate memory cell comprises a bottom word line, a first insulating layer formed on the bottom word line, a P-type float channel formed on the first insulating layer and kept at a floating state, a second insulating layer formed on the P-type float channel, a float gate, a third insulating layer formed on the float gate, a top word line formed on the third insulating layer, and a N-type drain region and a N-type source region formed at both sides of the float channel. In the float gate formed on the second insulating layer, charges are stored. Here, data are written in the float gate depending on levels of the bottom word line and the top word line, and data are read according to different channel resistances induced to the float channel depending on polarity states of charges stored in the float gate.

In still another embodiment, a float gate memory device comprises a plurality of unit memory cell arrays. Each of the plurality of unit memory cell arrays includes a plurality of float gate memory cells. Here, the float gate memory cell comprises a bottom word line, a first insulating layer formed on the bottom word line, a P-type float channel formed on the first insulating layer and kept at a floating state, a second insulating layer formed on the P-type float channel, a float gate, a third insulating layer formed on the float gate, a top word line formed on the third insulating layer, and a N-type drain region and a N-type source region formed at both sides of the float channel. In the float gate formed on the second insulating layer, charges are stored. Here, the plurality of float gate memory cells in each of the plurality of unit memory cell arrays are connected in common to the bottom word line, data are written in the float gate depending on a level of the top word line while the bottom word line is selected, and data are read according to different channel resistances induced to the float channel depending on polarity states of charges stored in the float gate.

In still another embodiment, a float gate memory device comprises a plurality of serially connected memory cells, a first switching element for selectively connecting the plurality of memory cells to a bit line in response to a first selecting signal, and a second switching element for selectively connecting the plurality of memory cells to a sensing line in response to a second selecting signal. In the plurality of connected serially memory cells, data applied through a bit line are stored in a float gate depending on potentials applied to a top word line and a bottom word line or data stored in the float gate are outputted to the bit line. Here, each of the plurality of memory cells comprises a first insulating layer formed on the bottom word line, a P-type float channel, a N-type drain region and a N-type source region formed at both sides of the P-type float channel, a second insulating layer formed on the P-type float channel, the float gate formed on the second insulating layer, and a third insulating layer formed on the float gate and under the top word line. Resistance of the P-type float channel formed on the first insulating layer is changed depending on the polarity of the float gate.

In still another embodiment, a float gate memory device comprises a plurality of top word lines arranged in parallel with a plurality of bottom word lines in a row direction, a plurality of bit lines arranged in a column direction, a plurality of sensing lines arranged perpendicular to the plurality of bit lines, a plurality of memory cell arrays, and a plurality of sense amplifiers. The plurality of memory cell arrays are arranged where the plurality of top word lines, the plurality of bottom word lines and the plurality of bit lines are crossed. The plurality of sense amplifiers, corresponding one by one to the plurality of bit lines, sense and amplify data in the bit line. Here, each of the plurality of memory cell arrays comprises a plurality of serially connected memory cells, a first switching element for selectively connecting the plurality of memory cells to a bit line in response to a first selecting signal, and a second switching element for selectively connecting the plurality of memory cells to a sensing line in response to a second selecting signal. In the plurality of connected serially memory cells, data applied through a bit line are stored in a float gate depending on potentials applied to a top word line and a bottom word line or data stored in the float gate are outputted to the bit line. Each of the plurality of memory cells comprises a first insulating layer formed on the bottom word line, a P-type float channel, a N-type drain region and a N-type source region formed at both sides of the P-type float channel, a second insulating layer formed on the P-type float channel, the float gate formed on the second insulating layer, and a third insulating layer formed on the float gate and under the top word line. Resistance of the P-type float channel formed on the first insulating layer is changed depending on the polarity of the float gate.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
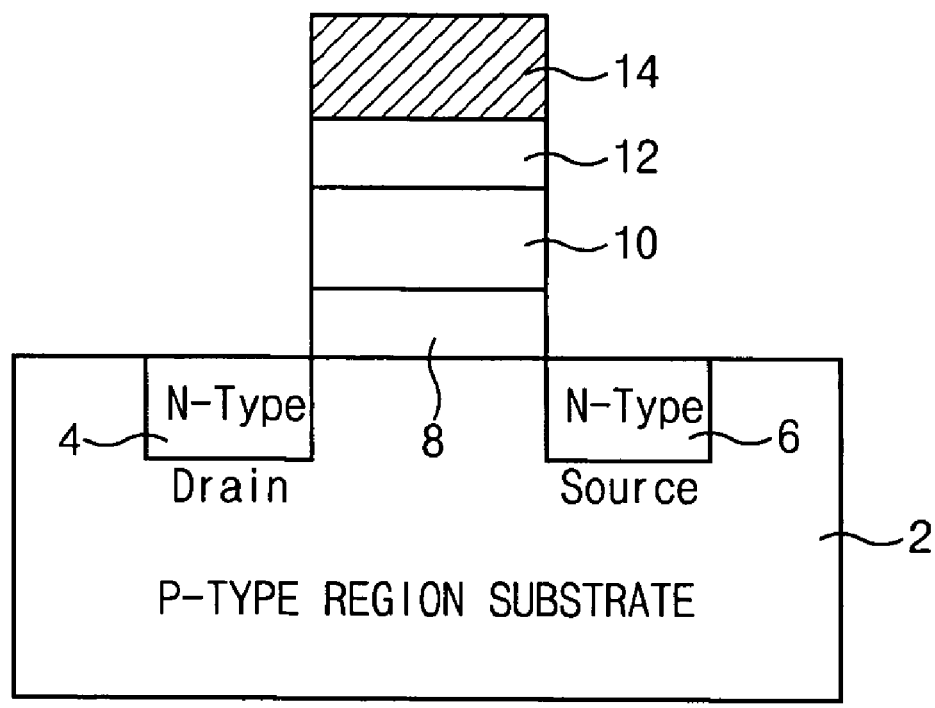
FIG. 1 is a cross-sectional diagram illustrating a memory cell of a conventional float gate memory device.
Figure 2A:
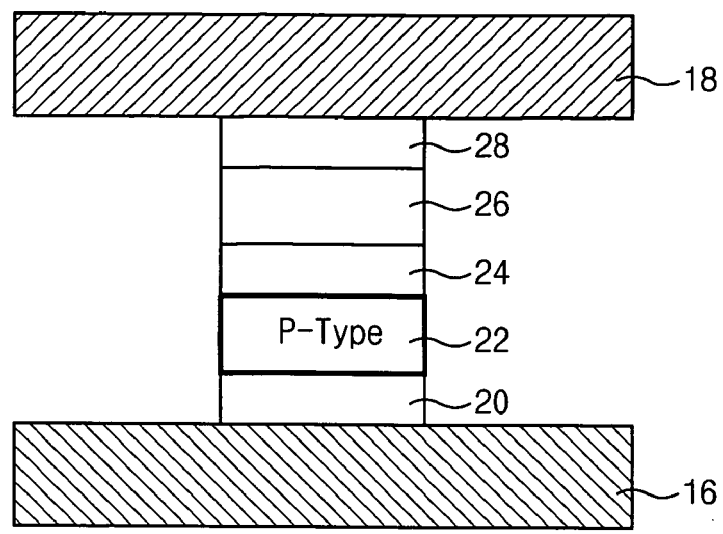
FIG. 2a is a cross-sectional diagram illustrating a unit memory cell cut in a direction parallel with a word line in a float gate memory device according to an embodiment of the present invention.

FIG. 2a is a cross-sectional diagram illustrating a unit memory cell cut in a direction parallel with a word line in a float gate memory device according to an embodiment of the present invention.

In the unit memory cell, a bottom word line 16 is formed in the bottom layer, and a top word line 18 is formed in the top layer. The bottom word line 16 is arranged in parallel with the top word line 18 and driven by the same row address decoder.

A first insulating layer 20, a float channel 22, a second insulating layer 24, a float gate 26 and a third insulating layer 28 are sequentially formed on the bottom word line 16. Here, the float channel 22 is formed with a P-type semiconductor.

Figure 2B:
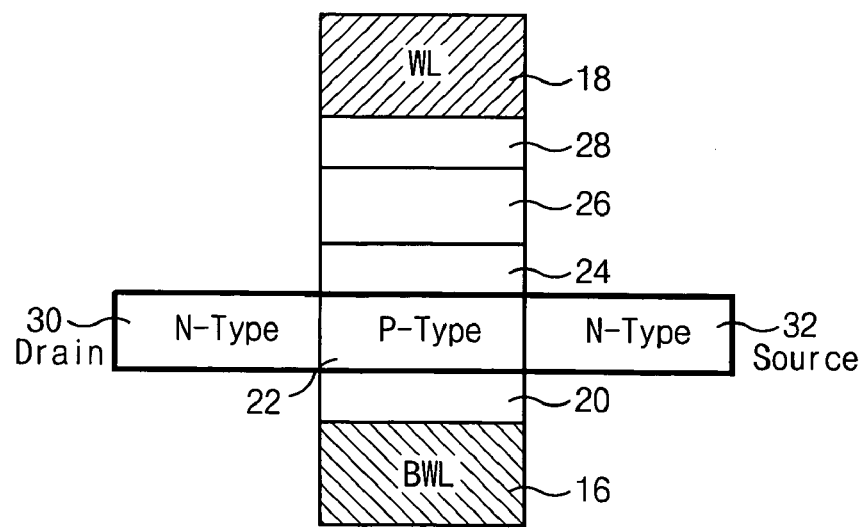
FIG. 2b is a cross-sectional diagram illustrating a unit memory cell cut in a direction perpendicular to a word line in a float gate memory device according to an embodiment of the present invention.

FIG. 2b is a cross-sectional diagram illustrating the unit memory cell cut in a direction perpendicular to the word line in the float gate memory device according to an embodiment of the present invention.

In the unit memory cell, the bottom word line 16 is formed in the bottom layer, and the top word line 18 is formed in the top layer. The bottom word line 16 is arranged in parallel with the top word line 18.

The first insulating layer 20, the float channel 22, the second insulating layer 24, the float gate 26 and the third insulating layer 28 are sequentially formed on the bottom word line 16. Here, a N-type drain 30 and a N-type source 32 are formed at both sides of the float channel 22.

The float channel 22, the N-type drain 30 and the N-type source 32 are formed of at least one of carbon nano tube, silicon, Ge and other materials.

A channel resistance of the unit memory cell of the float gate memory device is changed depending on a state of charges stored in the float gate 26.

In other words, since positive channel charges are induced to the channel of the memory cell when electrons are stored in the float gate 26, the memory cell is turned off at a high resistance channel state.

Meanwhile, since negative charges are induced to the channel when positive holes are stored in the float gate 26, the memory cell is turned on at a low resistance channel state.

In this way, data are written by selecting kinds of charges of the float gate 26, so that the memory cell can be operated as a nonvolatile memory cell.

Figure 2C:
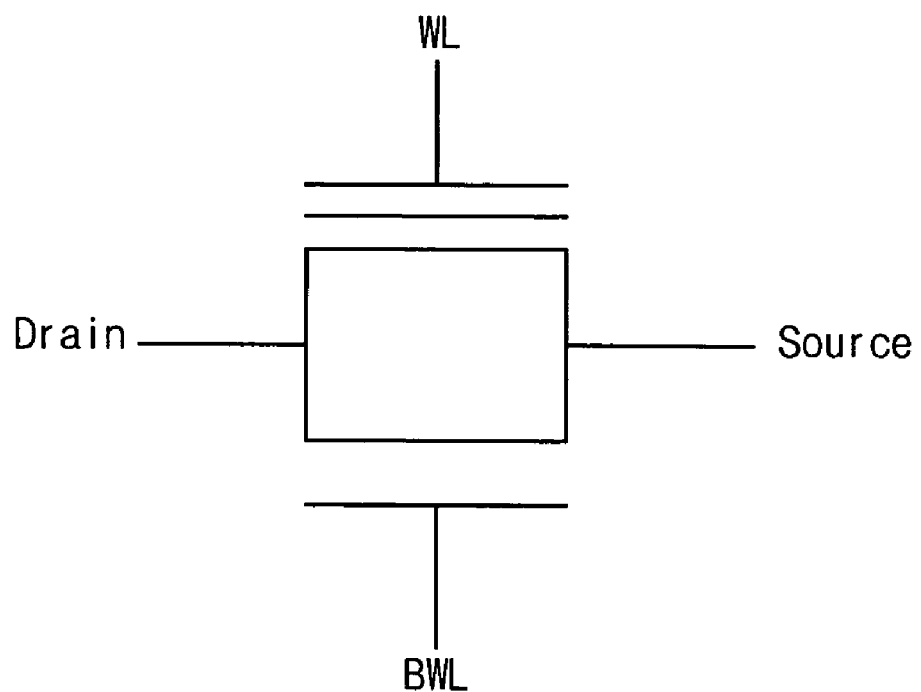
FIG. 2c is a circuit diagram illustrating the unit memory cell of FIG. 2b.

The above-described unit memory cell according to the embodiment of the present invention is represented by a symbol shown in FIG. 2c.

Figure 3A:
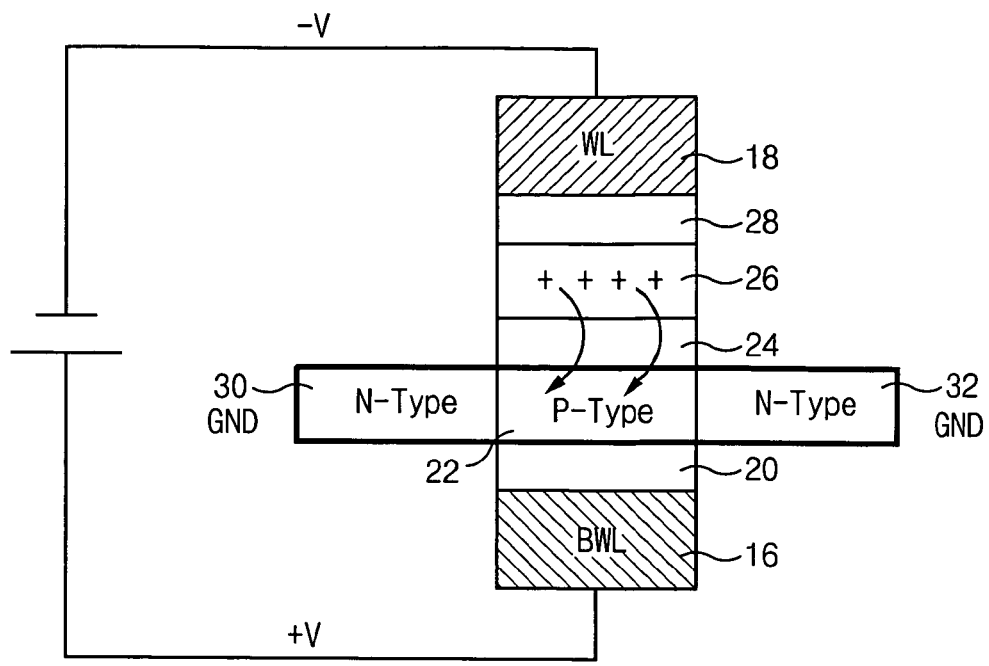
FIGS. 3a and 3b are diagrams illustrating write and read operations on high level data "1" of a float gate memory device according to an embodiment of the present invention.
Figure 3B:
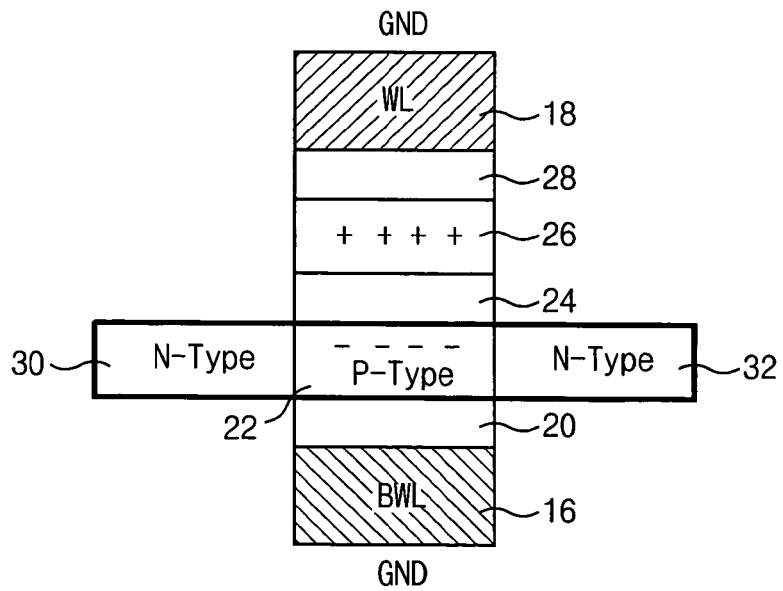

FIGS. 3a and 3b are diagrams illustrating write and read operations on high level data "1" of a float gate memory device according to an embodiment of the present invention.

FIG. 3a is a diagram illustrating the write operation of high level data "1".

A positive voltage +V is applied to the bottom word line 16, and a negative voltage −V is applied to the top word line 18. Here, the drain region 30 and the source region 32 become at a ground voltage GND state.

In this case, when a voltage is applied between the float gate 26 and the channel region 22 by voltage division of a capacitor among the first insulating layer 20, the second insulating layer 24 and the third insulating layer 28, electrons are emitted to the channel region 22. As a result, the positive charges are accumulated in the float gate 26.

FIG. 3b is a diagram illustrating the read operation of high level data "1".

When a ground voltage GND is applied to the bottom word line 16 and the top word line 18, negative charges are induced to the channel region 22, and the drain region 30 and the source region 32 become at the ground state, so that the channel region 22 is turned on.

As a result, in the read mode, data "1" stored in the memory cell can be read. Here, when a slight voltage difference is applied to the drain region 30 and the source region 32, the channel region 22 is turned on, so that a large amount of current flows.

Figure 4A:
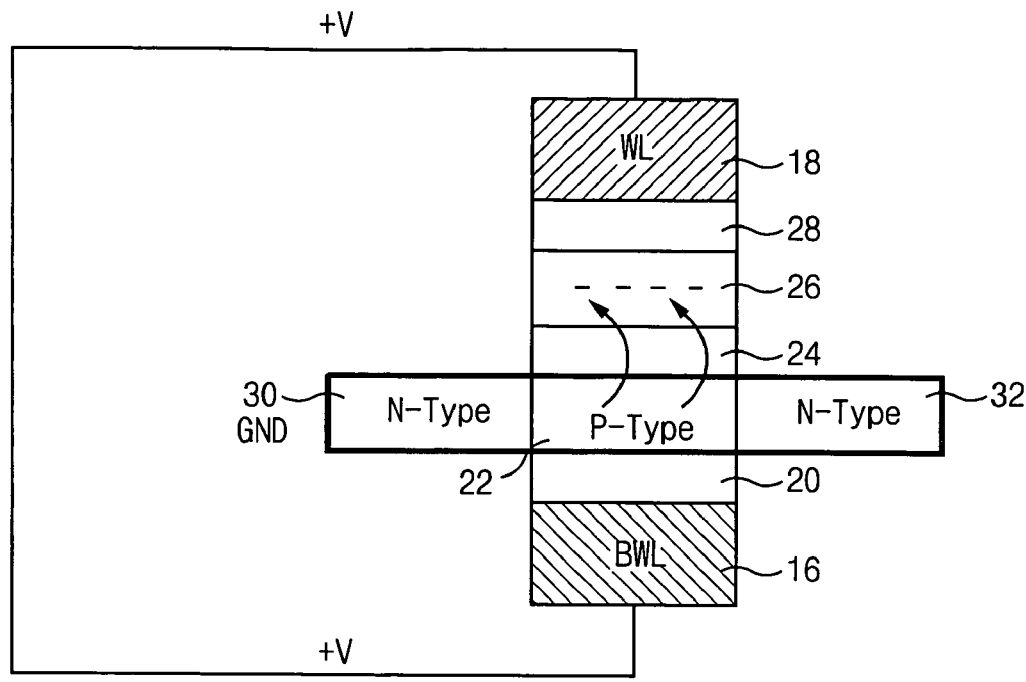
FIGS. 4a and 4b are diagrams illustrating write and read operations on low level data "0" of a float gate memory device according to an embodiment of the present invention.
Figure 4B:
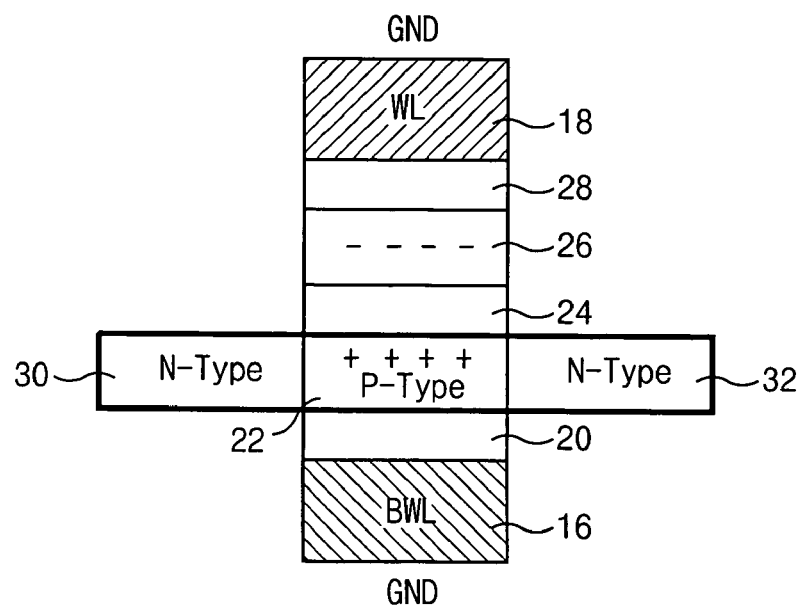

FIGS. 4a and 4b are diagrams illustrating write and read operations on low level data "0" of a float gate memory device according to an embodiment of the present invention.

FIG. 4a is a diagram illustrating the write operation of low level data "0".

When the ground voltage GND is applied to the drain region 30 and the source region 32, and a positive voltage +V is applied to the bottom word line 16 and the top word line 18, the channel is turned on, so that a channel of the ground voltage is formed in the channel.

Since a high voltage difference is formed between the ground voltage of the channel and the positive voltage +V of the top word line 18, electrons of the channel region move toward the float gate 26, so that electrons are accumulated in the float ate 26.

Meanwhile, when the positive voltage +V is applied to the drain region 30 and the source region 32 while the high level data "1" is stored in the float gate 26, the channel is turned off, so that the channel of the ground voltage is not formed in the channel.

Since there is no voltage difference between the positive voltage of the channel at the floating state and the positive voltage +V of the top word line 18, the electrons do not move toward the float gate 26.

As a result, the float gate 26 is maintained at the previous state. That is, since the previously stored high level data "1" is maintained, the high level data "1" is written in all of the memory cells, and the low level data "0" is selectively written.

FIG. 4b is a diagram illustrating the read operation of the low level data "0".

When the ground voltage GND is applied to the bottom word line 16 and the top word line 18, and a slight voltage difference is applied between the drain region 30 and the source region 32, the channel is turned off, so that a small amount of current flows.

In the read mode, the bottom word line 16 and the top word line 18 are at the ground voltage state. As a result, since a voltage stress is not applied to the float gate 26, the retention characteristic of the memory cell is improved.

Figure 5:
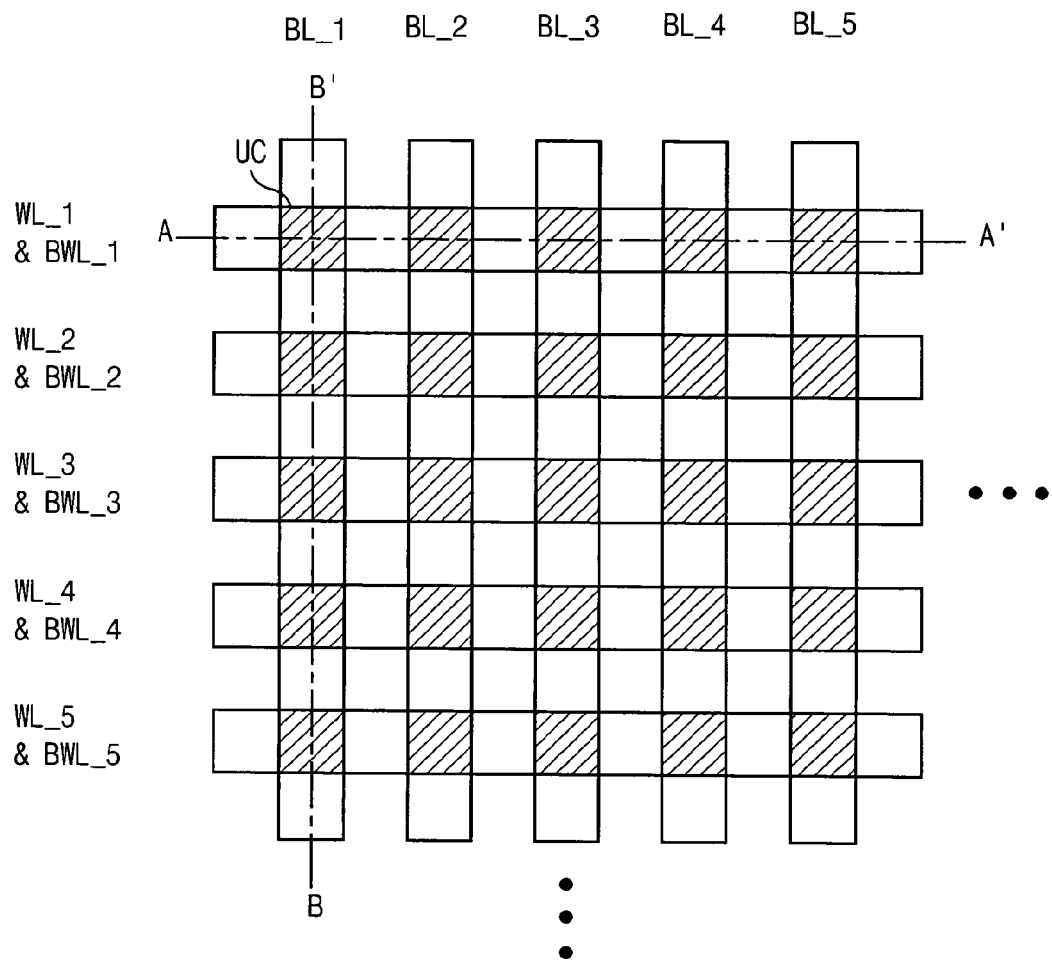
FIG. 5 is a layout plane diagram illustrating a float gate memory device according to an embodiment of the present invention.

FIG. 5 is a layout plane diagram illustrating a float gate memory device according to an embodiment of the present invention.

Referring to FIG. 5, a plurality of unit memory cells UC are arranged where a plurality of word lines WL and a plurality of bit lines BL are crossed.

The top word line WL is arranged in parallel with the bottom word line BWL in the same direction, and located perpendicular to the bit line BL.

Figure 6A:
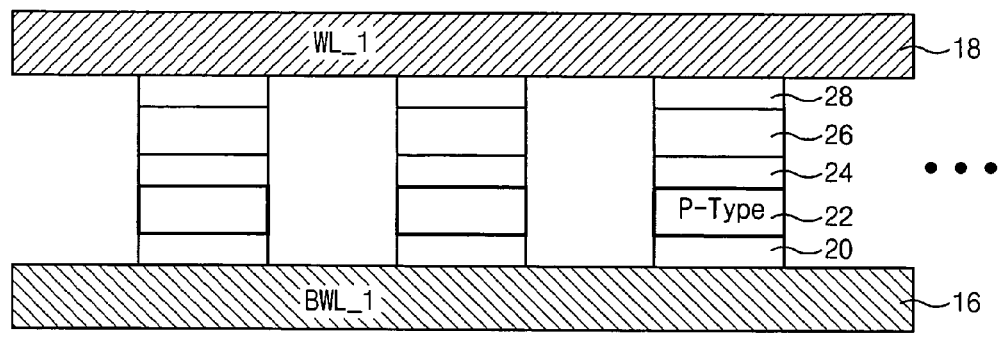
FIG. 6a is a cross-sectional diagram of a direction A-A' in parallel with a word line WL of FIG. 5.

FIG. 6a is a cross-sectional diagram of a direction A-A' in parallel with a word line WL of FIG. 5.

Referring to FIG. 6a, a plurality of unit memory cells UC are formed between the same bottom word line 16 BWL_1 and the top word line 18 WL_1 in a column direction.

Figure 6B:
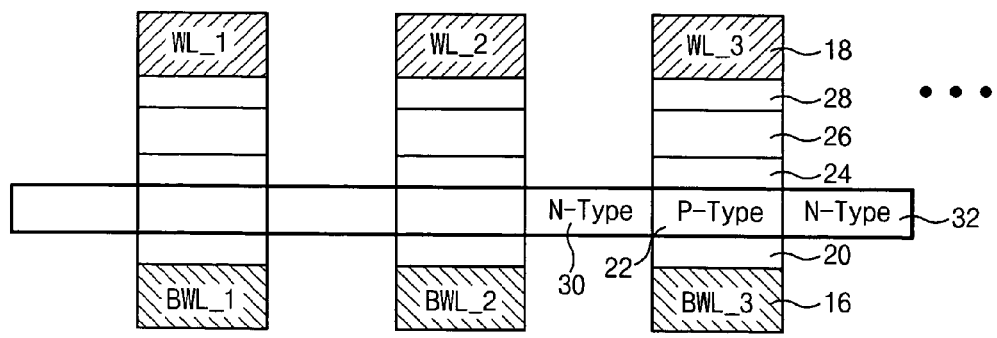
FIG. 6b is a cross-sectional diagram of a direction B-B' perpendicular to a word line WL of FIG. 5.

FIG. 6b is a cross-sectional diagram of a direction B-B' perpendicular to a word line WL of FIG. 5.

Referring to FIG. 6b, a plurality of unit memory cells UC are formed in the same bit line BL_1 in a row direction.

Figure 7:
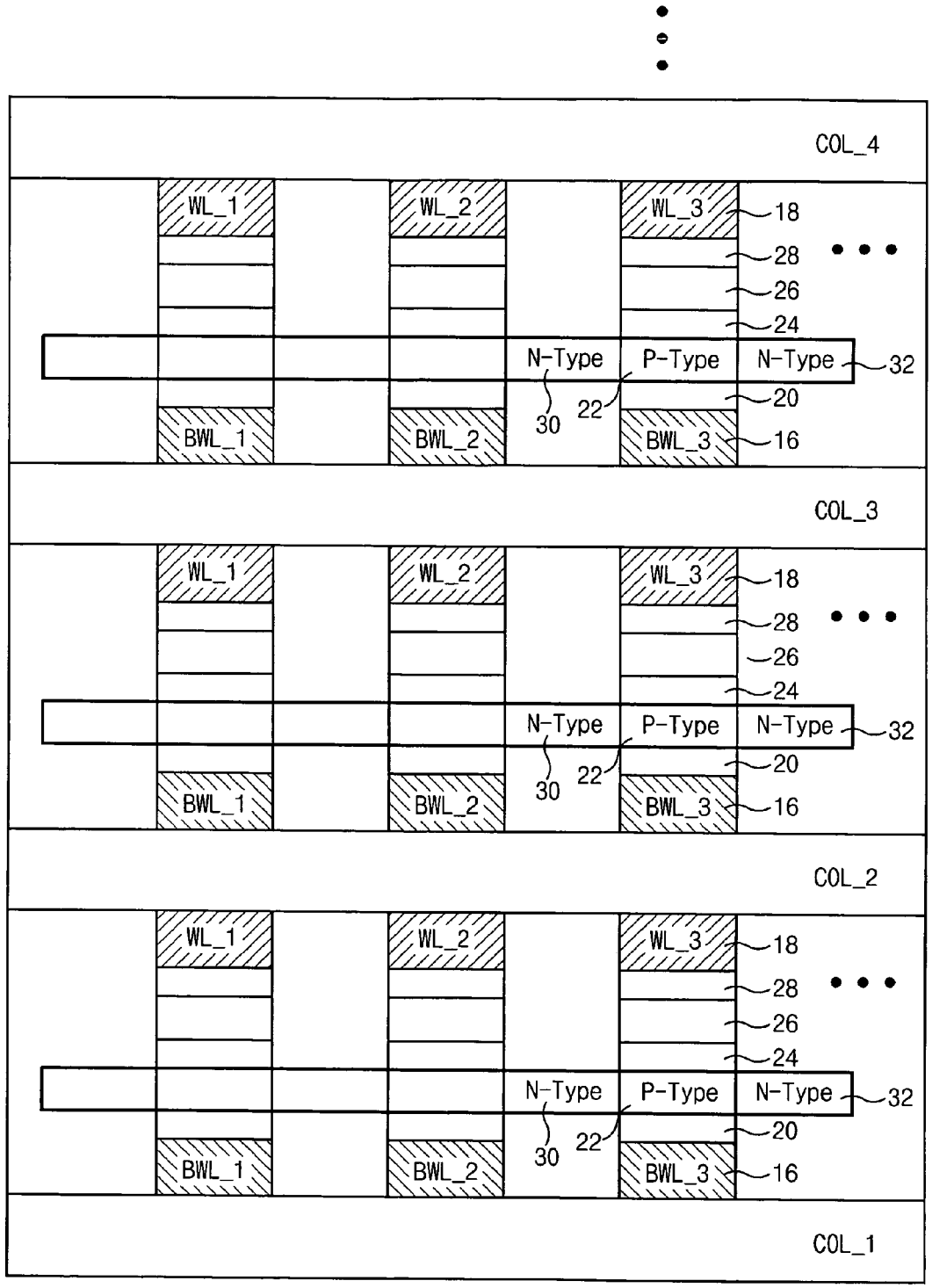
FIG. 7 is a cross-sectional diagram illustrating a float gate memory device having a multiple layer structure according to an embodiment of the present invention.

FIG. 7 is a cross-sectional diagram illustrating a float gate memory device having a multiple layer structure according to an embodiment of the present invention.

Referring to FIG. 7, a plurality of cell oxide layers COL_1~COL_4 are formed, and a plurality of float gate cell arrays are deposited in a cross-sectional direction. As a result, the integrated capacity of the cells can be increased in the same area corresponding to the number of deposited cell arrays.

Figure 8:
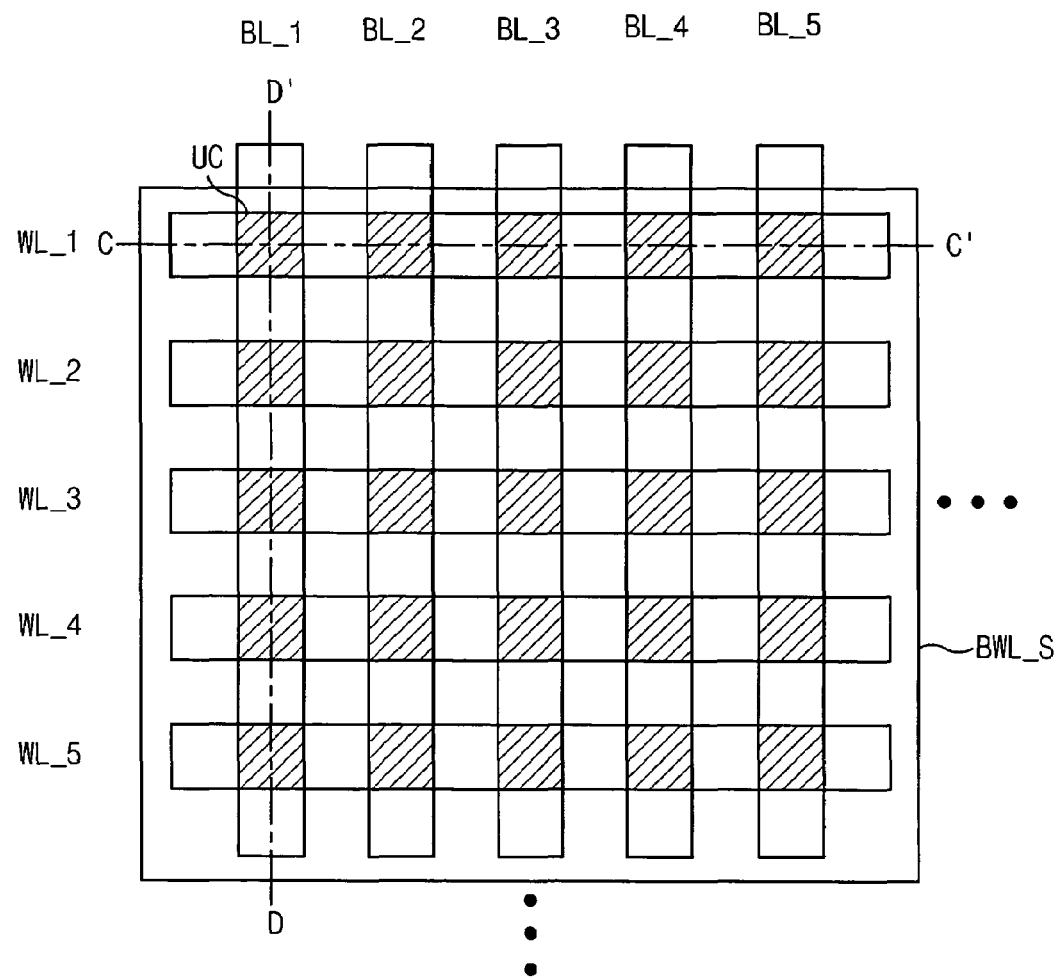
FIG. 8 is a layout plane diagram illustrating a float gate memory device according to another embodiment of the present invention.

FIG. 8 is a layout plane diagram illustrating a float gate memory device according to another embodiment of the present invention.

Referring to FIG. 8, the bottom word line 16 BWL_S is used in common in a predetermined cell array range although FIG. 8 is similar to FIG. 5. The float gate memory device of FIG. 8 comprises a plurality of top word lines 18 WL in a column direction, a plurality of bit lines BL in a row direction, and a plurality of unit memory cells UC arranged where the plurality of top word lines 18 WL and the plurality of bit lines BL are crossed.

Figure 9A:
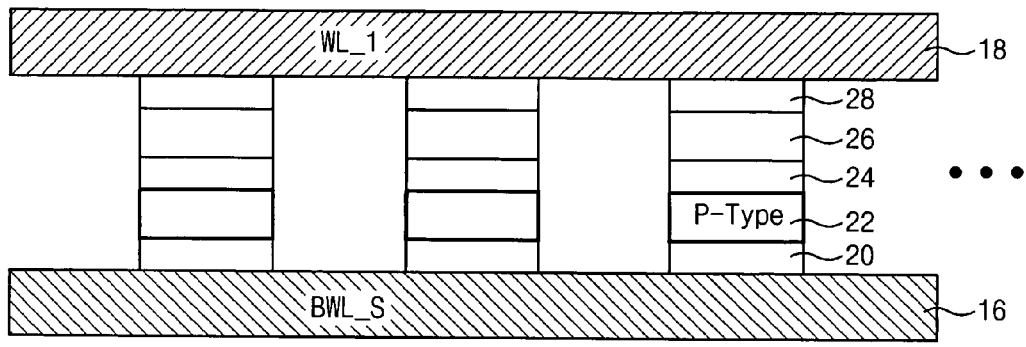
FIG. 9a is a cross-sectional diagram of a direction C-C' in parallel with a word line WL of FIG. 8.

FIG. 9a is a cross-sectional diagram of a direction C-C' in parallel with a word line WL of FIG. 8.

Referring to FIG. 9a, a plurality of unit memory cells UC are formed between the same bottom word line 16 BWL_1 and the same top word line 18 WL_1 in a column direction.

Figure 9B:
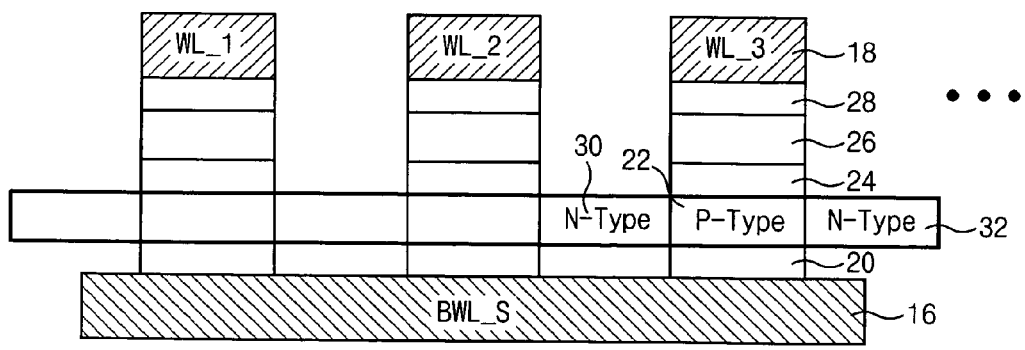
FIG. 9b is a cross-sectional diagram of a direction D-D' perpendicular to a word line WL of FIG. 8.

FIG. 9b is a cross-sectional diagram of a direction D-D' perpendicular to a word line WL of FIG. 8.

Referring to FIG. 9b, a plurality of unit memory cells UC are formed in the same bit line BL_1 in a row direction. Here, the bottom word line 16 BWL_S is connected in common.

Figure 10:
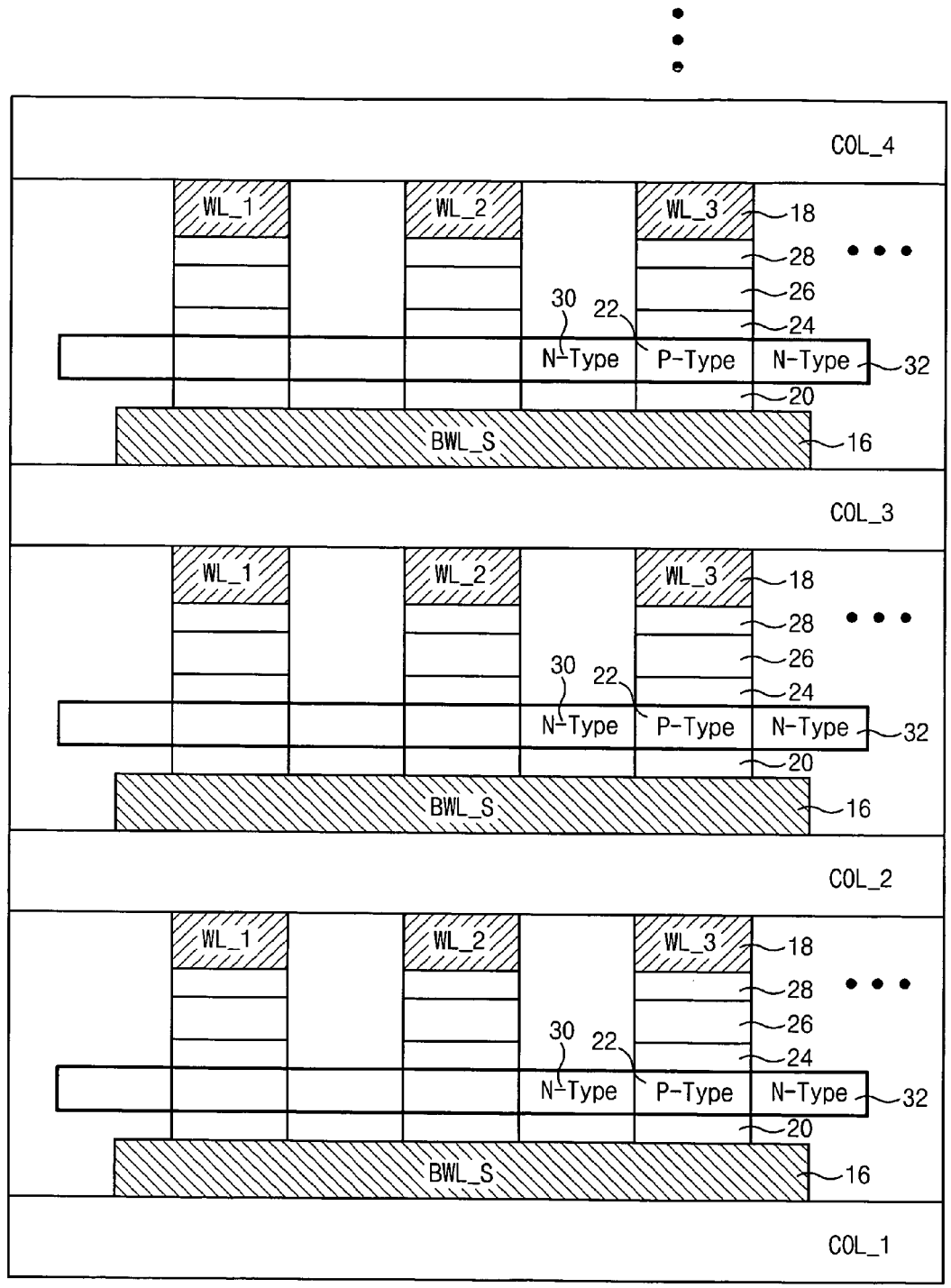
FIG. 10 is a cross-sectional diagram illustrating a float gate memory device having a multiple layer structure according to another embodiment of the present invention.

FIG. 10 is a cross-sectional diagram illustrating a float gate memory device having a multiple layer structure according to another embodiment of the present invention.

Referring to FIG. 10, the unit cell array of FIG. 8 is deposited as a multiple layer structure. Each of the unit cell arrays is separated by a plurality of cell oxide layers COL1~COL4.

Although the example where the N-type drain region 30 and the N-type source region 32 are formed at both sides of the P-type channel region 22 is illustrated, a P-type drain region and a P-type source region can be formed at both sides of the P-type channel region 22.

Figure 11:
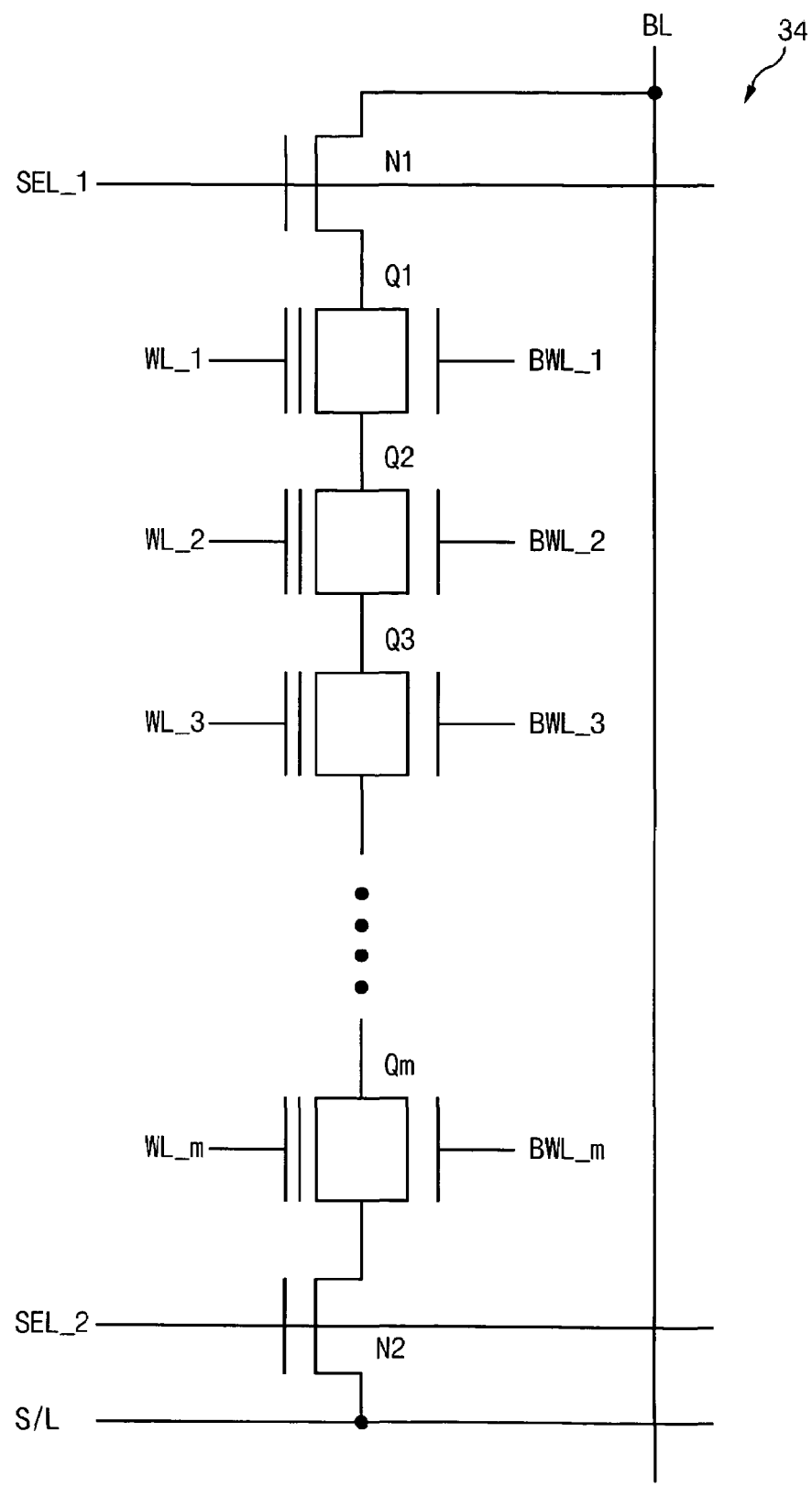
FIG. 11 is a diagram illustrating a unit memory cell array of a float gate memory device according to an embodiment of the present invention.

FIG. 11 is a diagram illustrating a unit memory cell array 34 of a float gate memory device according to an embodiment of the present invention.

In the embodiment, the unit memory array 34 of FIG. 11 comprises a plurality of memory cells Q1~Qm connected serially, and switching elements N1, N2. Here, the first switching element N1 has a gate to receive a first selecting signal Sel_1 to selectively connect the memory cell Q1 to the bit line BL, and the second switching element N2 has a gate to receive a second selecting signal SEL_2 to selectively connect the memory cell Qm to a sensing line S/L.

The plurality of memory cells Q1~Qm, which are connected serially between the switching elements N1 and N2, selectively perform a switching operation by a plurality of top word lines WL_1~WL_m and a plurality of bottom word lines BWL_1~BWL_m that are driven by the same row address decoder. Here, the detailed structure of each memory cell Q1~Qm is shown in FIGS. 2a and 2b.

Figure 12:
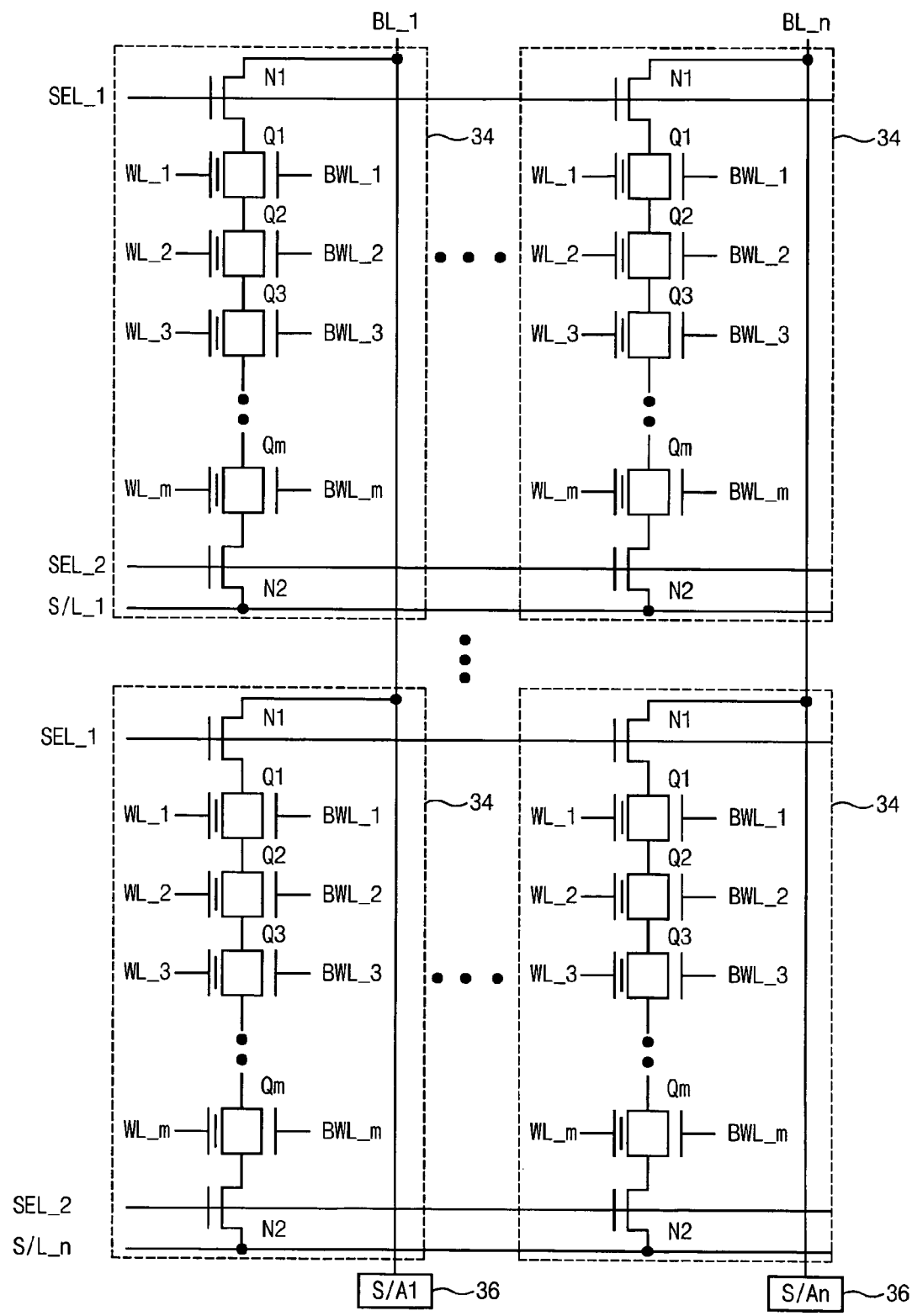
FIG. 12 is a diagram illustrating the structure of memory cell arrays of a float gate memory device according to an embodiment of the present invention.

FIG. 12 is a diagram illustrating the structure of memory cell arrays of a float gate memory device according to an embodiment of the present invention.

In the embodiment, the float gate memory device of FIG. 12 includes a plurality of unit memory cell arrays 34 which are connected in common to a plurality of bit lines BL_1~BL_n in a column direction, and in common to a plurality of top word lines WL_1~WL_m, a plurality of bottom word lines BWL_1~BWL_m, a plurality of first selecting signals SEL_11~SEL_1n, a plurality of second selecting signals SEL_21~SEL_2n and a plurality of sensing lines S/L_1~S/L_n in a row direction. Here, the plurality of bit lines BL_1~BL_n are connected one by one to a plurality of sense amplifiers 36.

Figure 13:
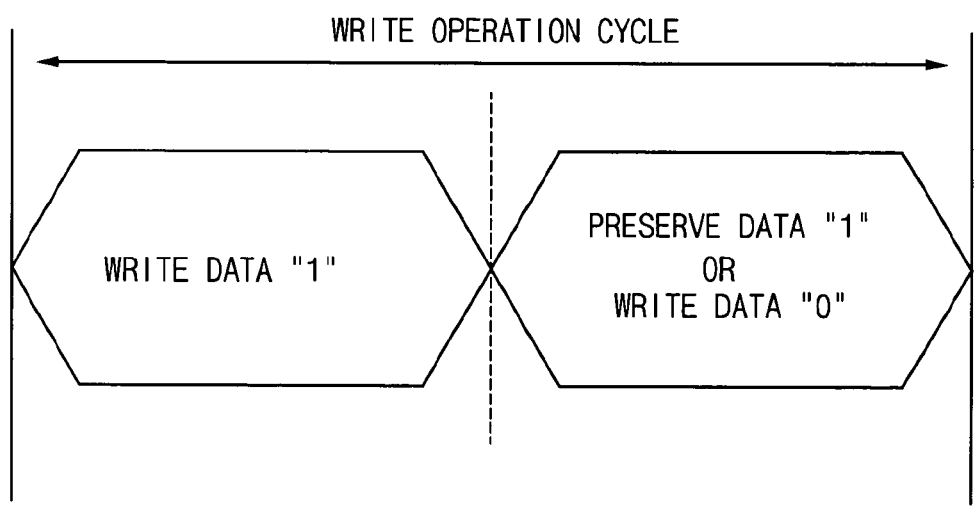
FIG. 13 is a diagram illustrating a write operation of a float gate memory device according to an embodiment of the present invention.

FIG. 13 is a diagram illustrating a write operation of a float gate memory device according to an embodiment of the present invention.

In the float gate memory device according to the embodiment of the present invention, a write operation cycle can be divided into two sub operation regions. That is, the data "1" is written in the first sub operation region. In the second sub operation region, the data "1" written in the first sub operation region is preserved or the data "0" is written.

If a high voltage is applied to the bit line BL in a predetermined period when the data "1" is required to be preserved, a value of the data "1" written in the first sub operation region can be preserved in the memory cell.

Figure 14:
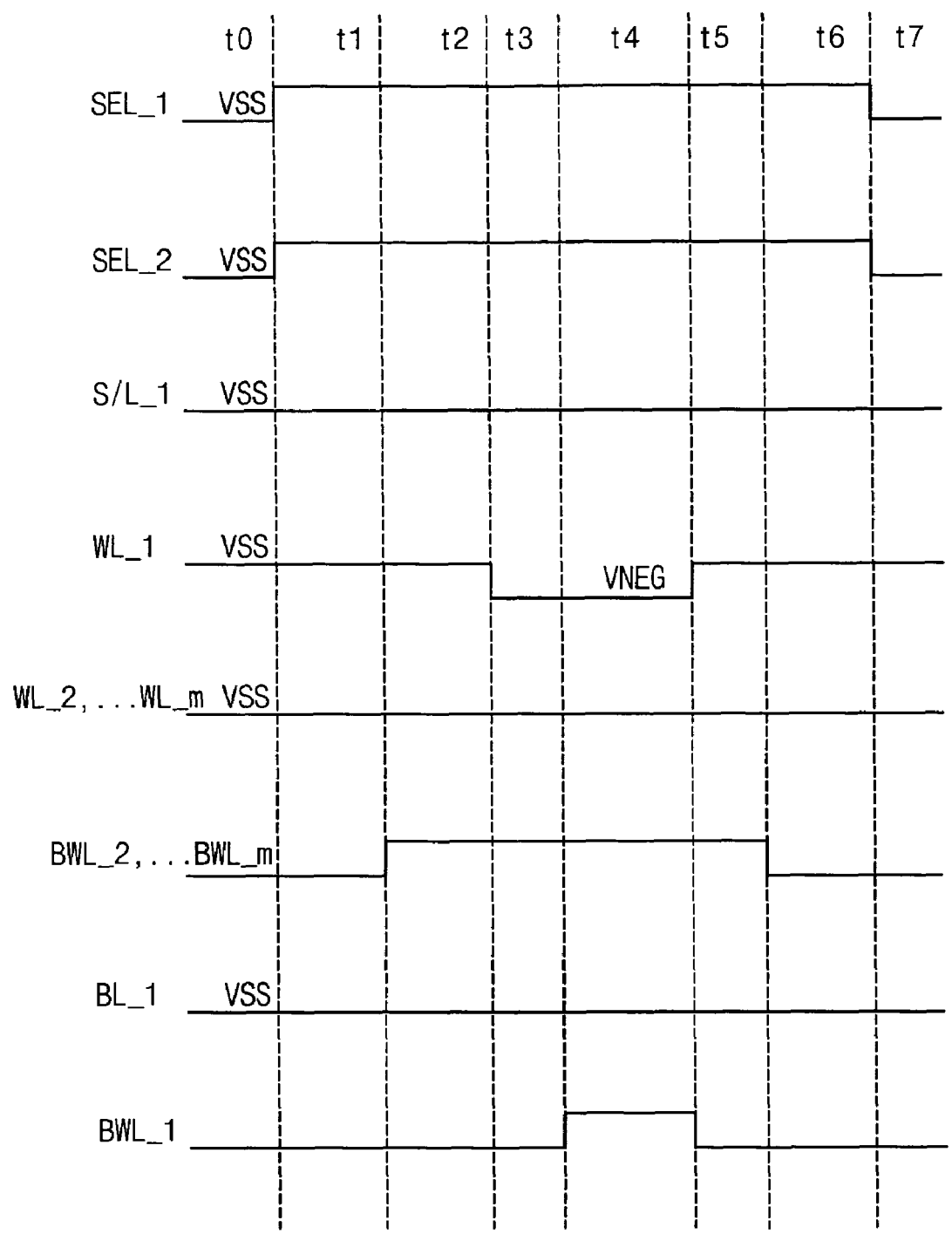
FIG. 14 is a timing diagram illustrating the write operation on data "1" of the float gate memory device according to an embodiment of the present invention.

FIG. 14 is a timing diagram illustrating the write operation on data "1" of the float gate memory device according to an embodiment of the present invention. Here, FIG. 14 shows an example where the first memory cell Q1 of the first unit memory cell array 34 of FIG. 6 is selected.

First, in a period t0 which is a precharge period of the memory cell, all signals and lines are precharged to a ground voltage VSS.

In a period t1, when the first selecting signal SEL_1 and the second selecting signal SEL_2 transit to 'high' to turn on the switching elements N1 and N2, the bit line BL_1 is connected to a source of the memory cell Q1, and the sensing line S/L is connected to a drain of the memory cell Qm. Here, the plurality of top word lines WL_1~WL_m, the plurality of bottom word lines BWL_1~BWL_m, the bit line BL_1 and the sensing line S/L_1 are maintained at a low level.

In a period t2, the rest bottom word lines BWL_2~BWL_m except the bottom word line BWL_1 connected to the selected memory cell Q1 transit to 'high'. As a result, the memory cells Q2~Qm except the selected memory cell Q1 are all turned on, so that the source of the selected memory cell Q1 is connected to a ground voltage VSS.

When a negative voltage VNEG is applied to the word line WL_1 connected to the selected memory cell Q1 in a period t3 and the bottom word line BWL_1 transits to 'high' in a period t4, as shown in FIG. 3a, electrons are emitted from the float gate 26 by voltage division of the top word line WL_1 and the bottom word line BWL_1, so that the data "1" is written.

When the top word line WL_1 and the bottom word line BWL_1 are transited to the ground voltage VSS level in a period t5 and the rest bottom word lines BWL_2~BWL_m are transited to the ground voltage VSS in a period t6, the rest memory cells Q2~Qm except the selected memory cell Q1 are turned off.

In a period t7, the first selecting signal SEL_1 and the second selecting signal SEL_2 are transited to the low level, the switching elements N1 and N2 are turned off, so that the write operation is completed.

Figure 15:
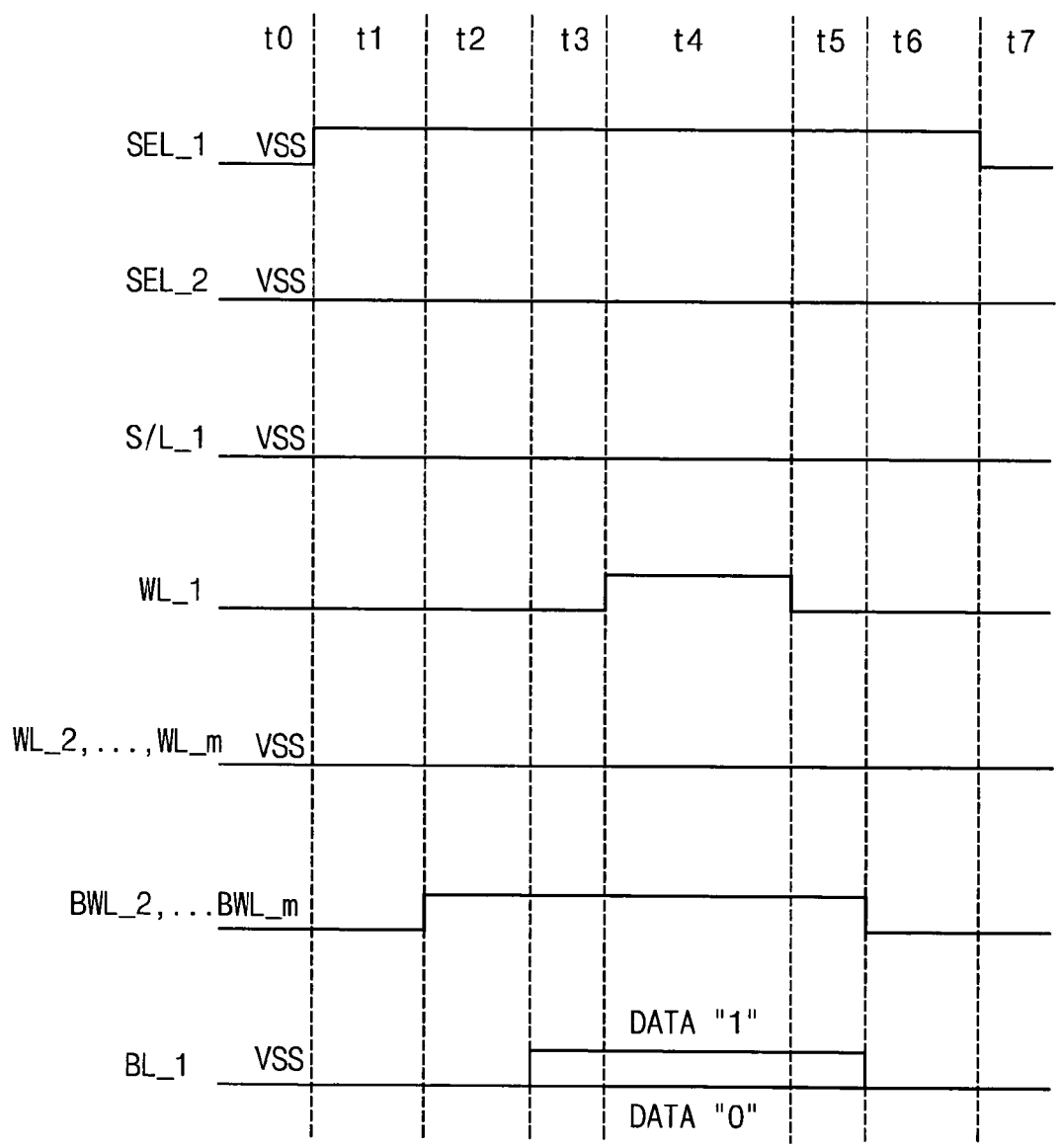
FIG. 15 is a timing diagram illustrating the retention operation of data "1" and the write operation on data "0" of the float gate memory device according to an embodiment of the present invention.

FIG. 15 is a timing diagram illustrating the retention operation of data "1" and the write operation on data "0" of the float gate memory device according to an embodiment of the present invention. FIG. 15 shows an example where the first memory cell Q1 of the first unit memory cell array 34 of FIG. 12 is selected.

First, in a period t0 which is a precharge period of the memory cell, all signals and lines are precharged to the ground voltage VSS.

In a period t1, when the first selecting signal SEL_1 transits to 'high', the first switching element N1 is turned on, so that the bit line BL_1 is connected to the source of the selected memory cell Q1.

Here, the second selecting signal SEL_2, the plurality of top word lines WL_1~WL_m, the plurality of bottom word lines BWL_1~BWL_m, the bit line BL_1 and the sensing line S/L_1 are maintained at the low level.

In a period t2, all of the bottom word lines BWL_1~BWL_m transit to 'high'. As a result, the memory cells Q1~Qm are all turned on to be connected to the bit line BL through the bottom word lines BWL_1 ~BWL_m, so that data applied to the bit line BL are transmitted to all of the memory cells Q1~Qm.

In a period t3, the bit line BL_1 is continuously maintained at the ground voltage VSS state when data to be written in the selected memory cell Q1 is "0", and the bit line BL_1 transits to 'high' when the data "1" stored in the selected memory cell Q1 is required to be maintained.

In a period t4, when the top word line WL_1 connected to the selected memory cell Q1 transits to 'high', as shown in FIG. 4a, electrons are accumulated in the P-type channel region 22 of the selected memory cell Q1 by the top word line WL_1. Thus, when a positive voltage is applied to the top word line WL_1 to generate a threshold voltage difference, channel electrons are introduced into the float gate 26. As a result, the data "0" is written in the selected memory cell Q1.

Meanwhile, when the data "1" stored in the selected memory cell Q1 is required to be maintained, a high level voltage is applied to the bit line BL_1, so that a voltage of the bit line BL_1 is applied to the selected memory cell Q1. As a result, since electrons are prevented from being formed in the channel region 22, the data "1" can be preserved.

The top word line WL_1 is transited to the ground voltage VSS state again in a period t5, and all of the bottom word lines BWL_1~BWL_m and the bit line BL_1 are transited to the ground voltage VSS state in a period t6, so that all of the memory cells Q1~Qm are turned off.

In a period t7, when the selecting signal SEL_1 is transited to the low level, the switching elements N1 is turned off to complete the write operation.

Figure 16:
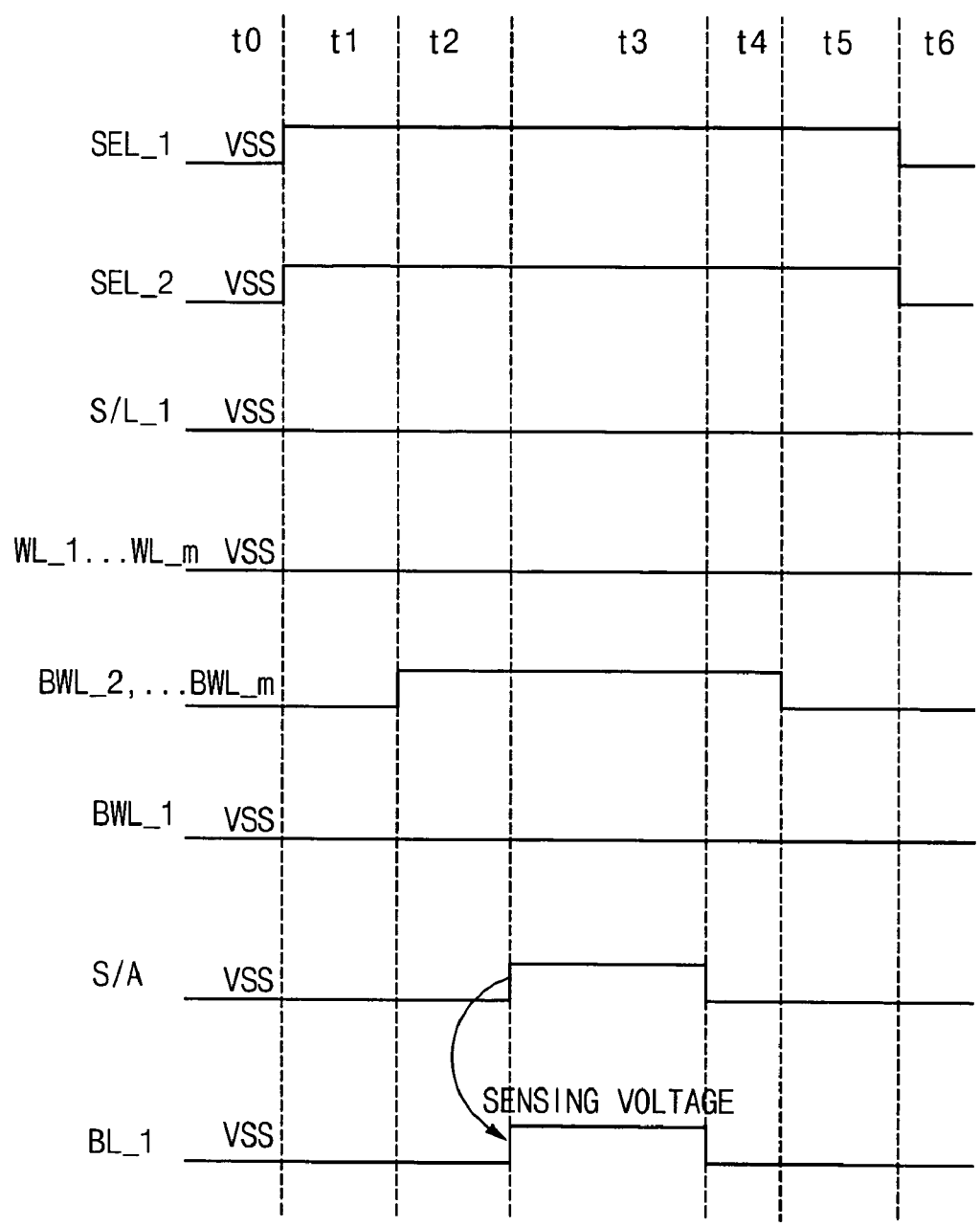
FIG. 16 is a timing diagram illustrating a sensing operation of data stored in a memory cell of the float gate memory device according to an embodiment of the present invention.

FIG. 16 is a timing diagram illustrating a sensing operation of data stored in a memory cell of the float gate memory device according to an embodiment of the present invention. Here, FIG. 16 shows an example where the first memory cell Q1 of the first unit memory cell array 34 of FIG. 6 is selected.

First, in a period t0 which is a precharge period of the memory cell, all signals and lines are precharged to the ground voltage VSS.

In a period t1, when the first selecting signal SEL_1 and the second selecting signal SEL_2 are transited to the high level so that the switching elements N1 and N2 are turned on, the bit line BL_1 is connected to the source of the selected memory cell Q1, and the sensing line S/L is connected to the drain of the memory cell Qm. Here, the plurality of top word lines WL_1~WL_m, the plurality of bottom word lines BWL_1~BWL_m, the bit line BL_1 and the sensing line S/L_1 are maintained at the low level.

In a period t2, the rest bottom word lines BWL_2~BLW_m except the bottom word line BWL_1 connected to the selected memory cell Q1 are transited to the high level. As a result, the memory cells Q2~Qm except the selected memory cell Q1 are all turned on, so that the source of the selected memory cell Q1 is connected to the ground voltage VSS.

Here, all of the word lines WL_1~WL_m are maintained at the ground voltage VSS state, so that the flowing of current between the bit line BL_1 and the sensing line S/L is determined depending on the polarity formed in the selected memory cell Q1.

In a period t3, the sense amplifier enable signal S/A is transited to a high level to operate the sense amplifier 36. Then, when a sensing voltage VS is applied to the bit line BL_1, the flowing of current in the bit line BL_1 is determined depending on the polarity of the selected memory cell Q1.

That is, as shown in FIG. 3b, when current is not applied to the bit line BL_1, it is understood that the data "1" is stored in the selected memory cell Q1.

On the other hand, as shown in FIG. 4b, when a current of over a predetermined value is applied to the bit line BL_1, it is understood that the data "0" is stored in the selected memory cell Q1.

In a period t4, when the sense amplifier enable signal S/A is at the ground voltage VSS level so that the operation of the sense amplifier 36 is stopped, the bit line BL_1 is transited to the low level to complete the sensing operation.

In a period t5, the bottom word lines BWL_2~BWL_m except the bottom word line BWL_1 connected to the selected memory cell Q1 are transited to the low level, all of the memory cells Q1~Qm are turned off.

In a period t6, the first selecting signal SEL_1 and the second selecting signal SEL_2 are transited to the low level, so that the switching elements N1 and N2 are turned off.

As a result, the data of the cell are not destroyed using a NDRO (Non Destructive Read Out) at the read mode in the embodiment of the present invention.

As described above, a float gate memory device according to an embodiment of the present invention has a memory cell structure using a float gate of a nano scale level to overcome a scale down phenomenon.

Additionally, in the float gate memory device, a plurality of float gate cell arrays are deposited vertically using a plurality of cell oxide layers to improve cell integrated capacity corresponding to the number of deposited cell arrays.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A float gate memory device comprising:
   a bottom word line;
   a float channel layer comprising a channel region, a drain region and source region, formed on the bottom word line and kept at a floating state;
   a float gate, formed on the float channel, where data are stored; and
   a top word line formed on the float gate in parallel with the bottom word line,
   wherein data are written in the float gate depending on levels of the bottom word line and the top word line, and
   data are read according to different channel resistances induced to the float channel depending on polarity states of charges stored in the float gate.

2. The float gate memory device according to claim 1, wherein the float channel layer is formed of at least one of carbon nano tube, silicon, germanium and organic semiconductor.

3. The float gate memory device according to claim 1, wherein the float channel layer comprises a N-type drain, a P-type channel and a N-type source.

4. The float gate memory device according to claim 1, wherein the float channel layer comprises a P-type drain, a P-type channel and a P-type source.

5. A float gate memory device comprising:
   a bottom word line;
   a first insulating layer formed on the bottom word line;
   a P-type float channel formed on the first insulating layer and kept at a floating state;
   a second insulating layer formed on the P-type float channel;
   a float gate, formed on the second insulating layer, where charges are stored;
   a third insulating layer formed on the float gate;
   a top word line formed on the third insulating layer in parallel with the bottom word line; and
   a N-type drain region and a N-type source region formed at both sides of the float channel, wherein data are written in the float gate depending on levels of the bottom word line and the top word line, and data are read according to different channel resistances induced to the float channel depending on polarity states of charges stored in the float gate.

6. The float gate memory device according to claim 5, wherein the float channel, the N-type drain region and the N-type source region are formed of at least one of carbon nano tube, silicon, germanium and organic semiconductor.

7. The float gate memory device according to claim 5, wherein the float channel is turned off when electrons are stored in the float gate so that positive charges are induced to the channel region to cause a high resistance state.

8. The float gate memory device according to claim 5, wherein the float channel is turned on when positive holes are stored in the float gate so that negative charges are induced to the channel region to cause a low resistance state.

9. The float gate memory device according to claim 5, wherein the float gate applies a positive voltage to the drain region and the source region while a positive voltage is applied to the bottom word line and the top word line so that previously stored high level data are maintained.

10. A float gate memory device comprising:
a plurality of unit memory cell arrays each including a plurality of float gate memory cells,
wherein the float gate memory cell comprises:
a bottom word line;
a first insulating layer formed on the bottom word line;
a P-type float channel formed on the first insulating layer and kept at a floating state;
a second insulating layer formed on the P-type float channel;
a float gate, formed on the second insulating layer, where charges are stored;
a third insulating layer formed on the float gate;
a top word line formed on the third insulating layer in parallel with the bottom word line; and
a N-type drain region and a N-type source region formed at both sides of the float channel,
wherein data are written in the float gate depending on levels of the bottom word line and the top word line, and
data are read according to different channel resistances induced to the float channel depending on polarity states of charges stored in the float gate.

11. The float gate memory device according to claim 10, wherein the plurality of unit memory cell arrays are separated by a cell array insulating layer, respectively.

12. A float gate memory device comprising:
a plurality of unit memory cell arrays each including a plurality of float gate memory cells,
wherein the float gate memory cell comprises:
a bottom word line;
a first insulating layer formed on the bottom word line;
a P-type float channel formed on the first insulating layer and kept at a floating state;
a second insulating layer formed on the P-type float channel;
a float gate, formed on the second insulating layer, where charges are stored;
a third insulating layer formed on the float gate;
a top word line formed on the third insulating layer in parallel with the bottom word line; and
a N-type drain region and a N-type source region formed at both sides of the float channel, wherein the plurality of float gate memory cells in each of the plurality of unit memory cell arrays are connected in common to the bottom word line, data are written in the float gate depending on a level of the top word line while the bottom word line is selected, and data are read according to different channel resistances induced to the float channel depending on polarity states of charges stored in the float gate.

13. The float gate memory device according to claim 12, wherein the plurality of unit memory cell arrays are separated by a cell array insulating layer, respectively.

14. A float gate memory device comprising:
a plurality of serially connected memory cells where data applied through a bit line are stored in a float gate depending on potentials applied to a top word line and a bottom word line or data stored in the float gate are outputted to the bit line;
a first switching element for selectively connecting one of the plurality of memory cells to a bit line in response to a first selecting signal; and
a second switching element for selectively connecting the other of the plurality of memory cells to a sensing line in response to a second selecting signal,
wherein each of the plurality of memory cells comprises:
the bottom word line;
a first insulating layer formed on the bottom word line;
a P-type float channel, formed on the first insulating layer, whose resistance is changed depending on the polarity of the float gate;
a N-type drain region and a N-type source region formed at both sides of the P-type float channel;
a second insulating layer formed on the P-type float channel;
the float gate formed on the second insulating layer;
a third insulating layer formed on the float gate and under the top word line; and
the top word line formed on the third insulating layer in parallel with the bottom word line.

15. The float gate memory device according to claim 14, wherein the first switching element and the second switching device are maintained at a turn-on state, a negative voltage is applied to the top word line, a positive voltage is applied to the bottom word line, and a ground voltage is connected to the bit line and the sensing line, so that high level data are written in the selected memory cell.

16. The float gate memory device according to claim 15, wherein a ground voltage is applied to the top word line of the other memory cells than the selected memory cell, and a positive voltage is applied to the bottom word line.

17. The float gate memory device according to claim 15, wherein the first switching element is kept on, the second switching element is kept off, a positive voltage is applied to the top word line and the bottom word line, and a positive voltage is applied to the bit line so that high level data stored in the selected memory cell are maintained.

18. The float gate memory device according to claim 17, wherein a ground voltage is connected to the top word line of the other memory cells than the selected memory cell.

19. The float gate memory device according to claim 15, wherein the first switching element is kept on, the second switching element is kept off, a positive voltage is applied to the top word line and the bottom word line, and a ground voltage is connected to the bit line so that low level data are written in the selected memory cell.

20. The float gate memory device according to claim 19, wherein a ground voltage is connected to the top word line of the other memory cells than the selected memory cell.

21. The float gate memory device according to claim 14, wherein the first switching element and the second switching element are kept on, a ground voltage is connected to the top word line, the bottom word line and the sensing line, and a sensing voltage is applied to the bit line so that data stored in the selected memory cell are sensed.

22. The float gate memory device according to claim 21, wherein a ground voltage is connected to the top word line of the other memory cells than the selected memory cell.

23. A float gate memory device comprising:
a plurality of top word lines arranged in parallel with a plurality of bottom word lines in a row direction;
a plurality of bit lines arranged in a column direction;
a plurality of sensing lines arranged perpendicular to the plurality of bit lines;
a plurality of memory cell arrays arranged where the plurality of top word lines, the plurality of bottom word lines and the plurality of bit lines are crossed; and
a plurality of sense amplifiers, corresponding one by one to the plurality of bit lines, for sensing and amplifying data in the bit line,
wherein each of the plurality of memory cell arrays comprises:
a plurality of serially connected memory cells where data applied through a bit line are stored in a float gate depending on potentials applied to a top word line and a bottom word line or data stored in the float gate are outputted to the bit line;
a first switching element for selectively connecting the plurality of memory cells to a bit line in response to a first selecting signal; and
a second switching element for selectively connecting the plurality of memory cells to a sensing line in response to a second selecting signal,
wherein each of the plurality of memory cells comprises:
a first insulating layer formed on the bottom word line;
a P-type float channel, formed on the first insulating layer, whose resistance is changed depending on the polarity of the float gate;
a N-type drain region and a N-type source region formed at both sides of the P-type float channel;
a second insulating layer formed on the P-type float channel;
the float gate formed on the second insulating layer; and
a third insulating layer formed on the float gate and under the top word line.

24. The float gate memory device according to claim 23, wherein the first switching element and the second switching element is kept on, a negative voltage is applied to the top word line, a positive voltage is applied to the bottom word line, a ground voltage is connected to the bit line and the sensing line so that high level data stored in the selected memory cell are maintained.

25. The float gate memory device according to claim 24, wherein a ground voltage is connected to the top word line of the other memory cells than the selected memory cell of the memory cell array connected to the selected memory cell, and a positive voltage is applied to the bottom word line.

26. The float gate memory device according to claim 24, wherein the first switching element is kept on, the second switching element is kept off, a positive voltage is applied to the top word line and the bottom word line, and a positive voltage is applied to the bit line so that high level data stored in the selected memory cell are maintained.

27. The float gate memory device according to claim 26, wherein a ground voltage is connected to the top word line of the other memory cells than the selected memory cell in the memory cell array connected to the selected memory cell.

28. The float gate memory device according to claim 24, wherein the first switching element is kept on, the second device is kept off, a positive voltage is applied to the top word line and the bottom word line, and a ground voltage is connected to the bit lien so that low level data are written in the selected memory cell.

29. The float gate memory device according to claim 28, wherein a ground voltage is connected to the top word line of the other memory cells than the selected memory cell in the memory cell array connected to the selected memory cell.

30. The float gate memory device according to claim 23, wherein the first switching element and the second switching element are kept on, a ground voltage is connected to the top word line, the bottom word line and the sensing line, and a sensing voltage is applied to the bit line so that data stored in the selected memory cell are sensed.

31. The float gate memory device according to claim 30, wherein a ground voltage is connected to the top word line of the other memory cells than the selected memory cell in the memory cell array connected to the selected memory cell.

* * * * *